United States Patent [19]
Maruyama

[11] Patent Number: 5,398,204
[45] Date of Patent: Mar. 14, 1995

[54] NONVOLATILE SEMICONDUCTOR SYSTEM

[75] Inventor: Akira Maruyama, Suwa, Japan

[73] Assignee: Seiko Epson Corporation, Tokyo, Japan

[21] Appl. No.: 148,520

[22] Filed: Nov. 8, 1993

[30] Foreign Application Priority Data

Nov. 9, 1992 [JP] Japan .................. 4-298854

[51] Int. Cl.⁶ .................. G11C 11/34; G11C 7/00
[52] U.S. Cl. .................. 365/185; 365/189.01; 365/218
[58] Field of Search .................. 365/185, 218, 189.01

[56] References Cited

U.S. PATENT DOCUMENTS

| | | | |
|---|---|---|---|
| 4,949,309 | 8/1990 | Rao | 365/185 |
| 5,185,718 | 2/1993 | Rinerson et al. | 365/185 |
| 5,241,507 | 8/1993 | Fong | 365/218 |

FOREIGN PATENT DOCUMENTS

| | | | |
|---|---|---|---|
| 0060266 | 3/1987 | Japan | 365/185 |
| 1-294297 | 11/1989 | Japan . | |
| 0308500 | 12/1990 | Japan | 365/218 |
| 4-3395 | 1/1992 | Japan . | |

Primary Examiner—Eugene R. LaRoche
Assistant Examiner—Son Dinh
Attorney, Agent, or Firm—Oliff & Berridge

[57] ABSTRACT

It is an object of the invention to provide a nonvolatile semiconductor system, particularly a flash (entire array erasure) type EEPROM, of which reading operation can be prevented from failing even if any one memory transistor is overerased. When the data reading operation is carried out for a memory transistor 1, an N-channel transistor 6 is turned off, and P-channel transistors 7 and 8 are also turned off, since a word line WL2 is at GND level. Even if a memory transistor 3 is overerased, for example, a drain current can be prevented from flowing from a bit line BL1 to a source power, which also prevents wrong reading operation. Even if any one memory transistor is overerased and not selected, a wrong reading operation can be prevented since no electric current flows from the bit line. Thus, any means for preventing the overerasing, such as verifying operation means or the like, is not required.

8 Claims, 12 Drawing Sheets

NONVOLATILE SEMICONDUCTOR SYSTEM

BACKGROUND OF THE INVENTION

1. Field of the Invention

The present invention relates to a nonvolatile semiconductor system and particularly to a flash (entire array erasure type) EEPROM circuit.

2. Description of the Related Art

Figure 11:
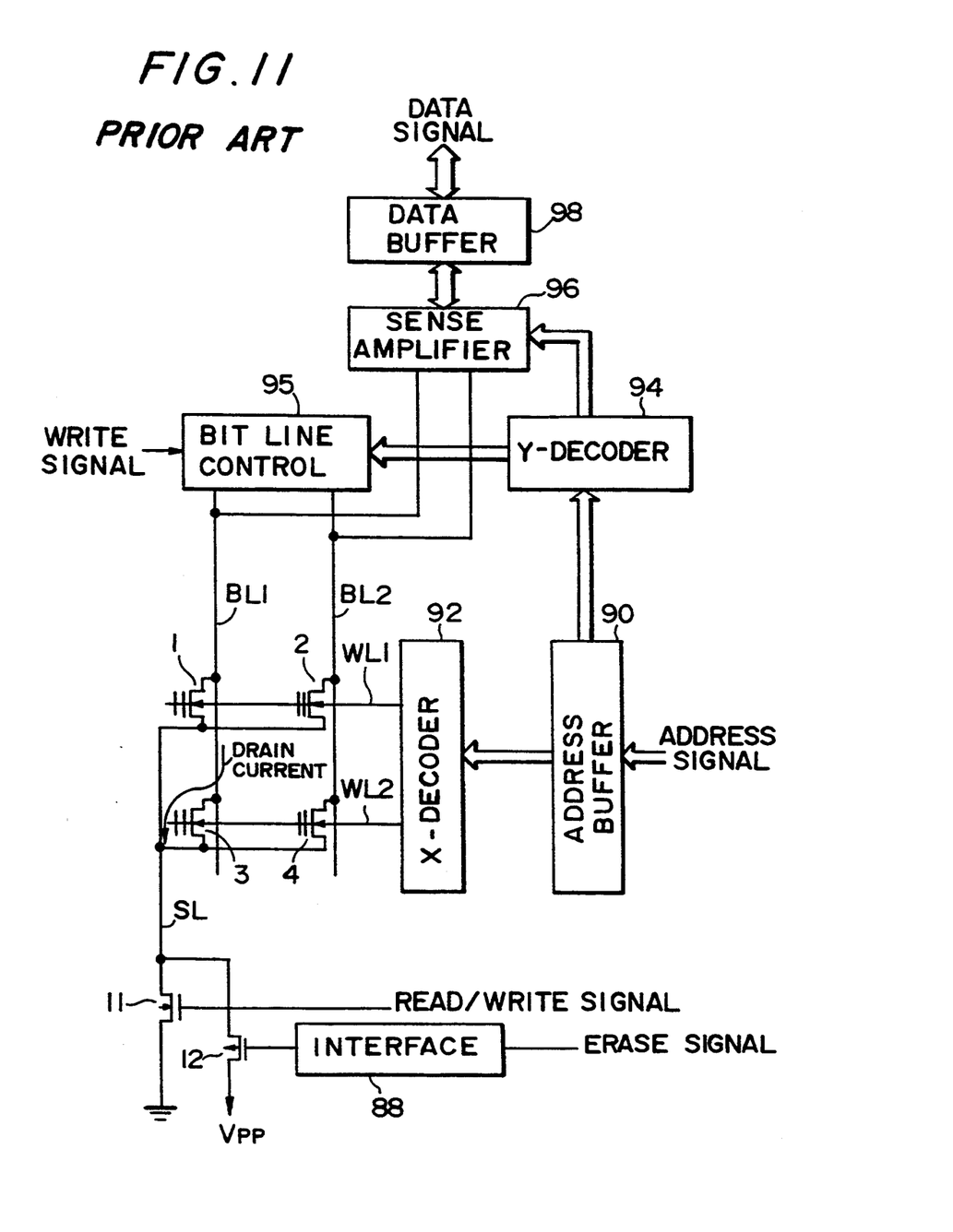
FIG. 11 is a circuit diagram of a nonvolatile semiconductor system constructed in accordance with the prior art.

In the accompanying drawings, FIG. 11 shows a flash type EEPROM circuit constructed in accordance with the prior art, which is illustrated as being of four-memory-transistor arrangement for simplicity.

As can be seen from FIG. 11, the flash type EEPROM circuit comprises four memory transistors 1-4 which have source regions connected to a common source line SL. The common source line SL is connected to N-channel and P-channel transistors 11 and 12. The gate electrode of the N-channel transistor 11 receives a read/write signal, while the gate electrode of the P-channel transistor 12 receives an erase signal through an interface circuit 88. The interface circuit 88 functions to convert a fluctuation of input voltage at Vdd-GND into a fluctuation of output voltage at Vpp-GND.

The control gate electrodes of the memory transistors 1-4 are connected to either word line WL1 or WL2, while the drain regions of the memory transistors 1-4 are connected to either bit line BL1 or BL2.

Address signals are inputted to X-decoder 92 and Y-decoder 94 through an address buffer 90. In response to this, the X-decoder 92 generates word line signals to the word lines WL1 and WL2, while the Y-decoder 94 generates Y-decoder signals, which are in turn outputted therefrom to a bit line control circuit 95 and a sense amplifier 96.

The bit line control circuit 95 is responsive to the Y-decoder signals to control the writing of data. More particularly, the bit line control circuit 95 writes data signals, inputted through the data buffer 98, in the memory transistors 1-4 at addresses represented by the Y-decoder signals. The bit line control circuit 95 also controls the erasing and reading-out at the memory transistors 1-4.

On the other hand, the sense amplifier 96 reads out data stored in the memory transistors 1-4 using the Y-decoder signals as addresses. The read data are then outputted, as data signals, from the sense amplifier 96 to any external unit through the data buffer 98.

Figure 12:
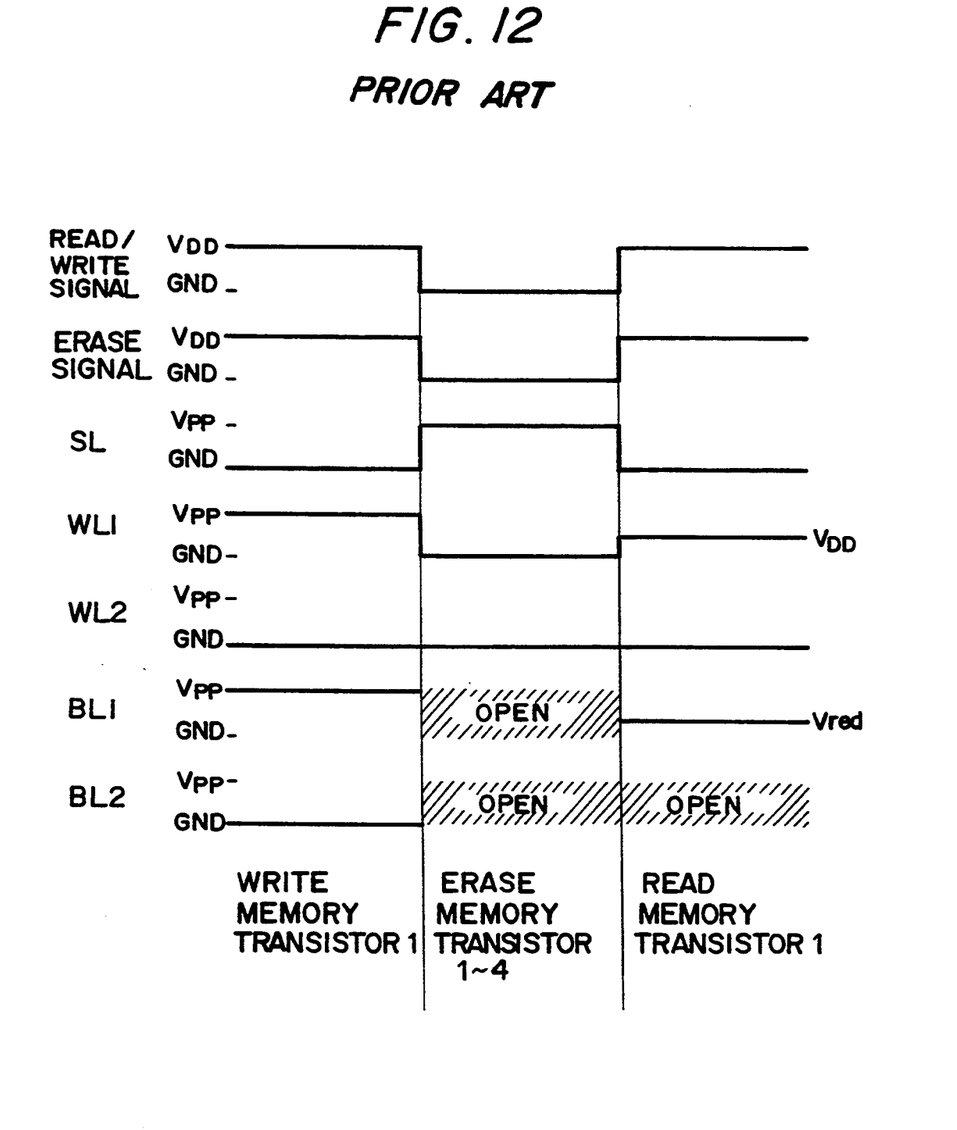
FIG. 12 is a diagram illustrating voltages at various different parts in the nonvolatile semiconductor system of the prior art.

The operation of such a prior art system will now be described with reference to FIG. 12 which illustrates the voltages at various different components.

The writing operation will first be described. In writing operation, read/write and erase signals are set at VDD level to place the transistor 11 in ON state and the transistor 12 in OFF state, respectively, as shown in FIG. 12. Thus, the common source line SL is set at GND level. When the writing operation is to be carried out for the memory transistor 1, the word and bit lines WL1 and BL1 are set at high voltage Vpp level (e.g. 12 volts), and WL2 and BL2 are set at GND level.

Under the above setting, the control gate electrode and drain region of only the memory transistor 1 are simultaneously placed at voltage of Vpp level to generate a channel current. As a result, hot electrons are generated at the drain region edge to inject electrons into the floating gate electrode. This causes the writing operation to be carried out for the memory transistor 1 so that data "0" will be stored therein. On the other hand, no channel current is generated in the other memory transistors 2-4 since the voltages at their control gate electrodes and drain regions are not simultaneously at Vpp level. Therefore, the writing operation will not be carried out for the memory transistors 2-4.

The erasing operation will be described. In the erasing operation, read/write and erase signals are set at GND level to turn the transistors 11 and 12 respectively off and on, as shown in FIG. 12. The common source line SL is thus set at Vpp level. In addition to such settings, the word lines WL1 and WL2 are set at GND level, while the bit line BL1 and BL2 are set at Open level.

Under the above setting, the source regions of the memory transistors 1-4 will be set at Vpp level while the control gate electrodes of the memory transistors will be set at GND level. Therefore, a tunnel current will be generated between the floating gate electrode and the source region in each memory transistor. As a result, electrons will be released from the floating gate electrode to the source region to perform the erasing operation.

The reading operation will be described. In the reading operation, read/write and erase signals are set at VDD level to turn the transistors 11 and 12 respectively on and off, as shown in FIG. 12. The common source line SL is thus set at GND level. When data is to be read out from the memory transistor 1, the word lines WL1 is set at VDD level; the bit line BL1 is set at read-out level Vred which is a positive voltage (e.g. 1 volt); the word line WL2 is set at GND level; and the bit line BL2 is set at Open level.

Under the above setting, only the memory transistor 1 will have the control gate electrode of VDD level, the drain region of Vred level and the source region of GND level. When the writing operation has been carried out for the memory transistor 1, or when data "0" has been stored in the memory transistor 1, the drain current will not flow in the bit line BL1. On the contrary, when the writing operation has not been carried out for the memory transistor 1, or when data "1" has been stored in the memory transistor 1, the drain current will flow in the bit line BL1. Therefore, the stored data can be read out by detecting the drain current at the sense amplifier 96.

The prior art has such a problem as that the electrons are excessively released to make the threshold voltage of the memory transistor negative or to produce an overerasing phenomenon, in the erasing operation.

It is now assumed that the memory transistor 3 has been overerased. It is also assumed that the writing operation has stored data "0" in the memory transistor 1. If data is read out from the memory transistor 1 under such a condition, any current ought not to flow through the bit line BL1, since the data "0" has been stored in the memory transistor 1. If the memory transistor 3 has been overerased, however, the drain current will flow even though the control gate electrode is at GND level, as shown in FIG. 11. The drain current causes the sense amplifier 96 to be subjected to malfunction, leading to a wrong judgment that the data "1" has been stored in the memory transistor 1. It results in the reading operation error.

One of techniques for preventing such an overerasing is described in Japanese Patent Application Laid-Open No. Hei 1-294297. The technique detects an electric current flowing through a memory transistor during the erasing operation. If the current is detected, the transistor providing the erasing voltage is turned off to stop the erasing operation.

This technique is disadvantageous in that means for detecting the current to turn the transistor off becomes complicated to increase the circuit in scale. Further, at a time when a memory transistor is overerased, the erasing operation For the other memory transistors is also stopped. This reduces the lower limit of operation margin in the other memory transistors.

Another technique for preventing the overerasing is a technique known as a verifying operation that is described in Japanese Patent Application Laid-Open No. Hei 4-3395, for example. The verifying operation monitors the threshold voltages in all the memory transistors at all times after the erasing operation. If the threshold voltages in all the memory transistors are equal to or lower than a preselected verify voltage, it is judged that a proper erasing operation has been carried out For each of the memory transistors. At this time, the subsequent erasing operations will be stopped. On the other hand, if the threshold voltage in even only one memory transistor is higher than the verify voltage, it is judged that the erasing operation has not properly been carried out. After the erasing operation has again been performed, the verifying operation is again carried out. The verifying and erasing operations will be repeated until all the memory transistors are properly erased.

However, the verifying operation has such a problem as that the circuit is undesirably increased in scale with a complicated control. Furthermore, the verifying operation cannot prevent the overerasing for a memory transistor erasable more quickly, that is, such a memory transistor that its threshold voltage is more shifted to the negative direction in the erasing operation.

SUMMARY OF THE INVENTION

In order to overcome the aforementioned problems, an object of the present invention is to provide a nonvolatile semiconductor system which can prevent wrong reading operation from being produced even if over-erasure takes place among memory transistors.

To this end, the present invention provides a nonvolatile semiconductor system comprising a plurality of memory transistors arranged in a matrix, each of said memory transistors comprising a floating gate electrode, a control gate electrode, a source region and a drain region, the data writing and erasing operations being carried out for each memory transistor by performing the injection and release of electrons to and from said floating gate electrode, the drain region, the source region and the control gate electrode of each of said memory transistors being respectively connected to a bit line, a source line and a word line, the improvement thereof comprising a first common source line to supply a source power required at least for the writing/reading operation to said source line, a second common source line to supply a source power required at least for the erasing operation to said source line, an N-channel transistor connected between said first common source line and said source line which is connected to the source regions of one or a plurality of said memory transistors whose said control gate electrodes connected to one of said word lines, a gate electrode of said N-channel transistor being connected to said word line, and a switching element connected between said source line and said second common source line and operative to be opened and closed by control signals.

According to the present invention, the electric current flowing through any non-selected memory transistor can be prevented from flowing into the first common source line when data is read out. Therefore, any wrong reading operation can be avoided even if there is an overerased memory transistor. As a result, the present invention does not require any other complicated means for preventing the overerasing, such as verifying means or the like. Thus, the hardware can be reduced in scale with increase of the operational speed. Since the threshold voltage of the memory transistors can sufficiently be lowered on the erasing operation, the lower voltage limit of operation margin in the memory transistors can be increased with increase of the reading speed.

It is desirable that the switching element is a P-channel transistor, the gate electrode of the P-channel transistor receiving an erase signal as said control signal by which the P-channel transistor is opened or closed.

In such an arrangement, voltage drop problem in the P-channel transistor, which is a switching element, can be eliminated. Therefore, the voltage level required for the erasing operation needs not be increased considering the voltage drop, which allows lowering of voltage required by the entire circuit and reduction of the power dissipation. Such an arrangement is very advantageous when the erasing operation is carried out for each block. More particularly, a block to be erased can be selected by dividing the erase signal which is a control signal. Therefore, the size of a transistor for selecting the block can be decreased to reduce the scale of the circuit with increase of the operational speed.

Furthermore, the switching element may be an N-channel transistor, the gate electrode of which receives an erase signal as said control signal. The erase signal is used to open or close the N-channel transistor which is an switching element.

Such an arrangement is very advantageous when the erasing operation is carried out for each block, although the problem of voltage drop is generated.

Another arrangement can be considered in which the switching element is an N-channel transistor, the gate electrode of the N-channel transistor being connected to the second common source line supplying said control signal. The N-channel transistor being the switching element may be opened or closed by the control signal.

In such an arrangement, any wrong reading operation can effectively be prevented even if any one memory transistor is overerased, although the problem of voltage drop is generated.

The first and second common source lines may be combined into a single common source line. This can reduce the scale of the circuit.

DETAILED DESCRIPTION OF THE PREFERRED EMBODIMENTS

(1) First Embodiment

Figure 1:
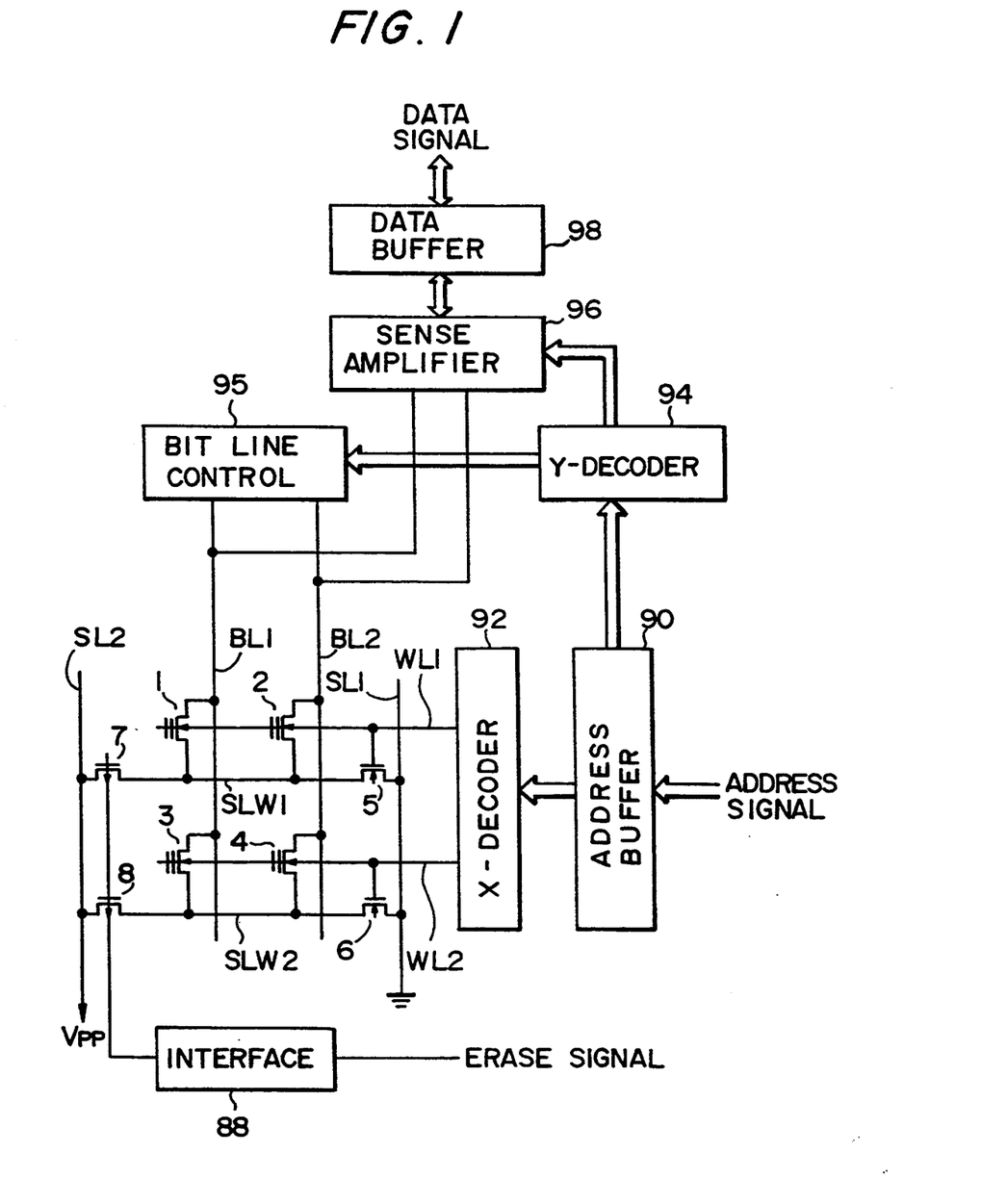
FIG. 1 is a circuit diagram of the first embodiment of a nonvolatile semiconductor system constructed in accordance with the present invention.

FIG. 1 is a circuit diagram of a flash EEPROM which shows the first embodiment of the present invention. For simplicity, it is assumed that the flash EEPROM is of four-memory-transistor arrangement. In practice, the memory section of the EEPROM may be defined by a desired number of memory transistors which are arranged in a matrix. In the following description, parts similar to those of FIG. 11, showing the prior art, are designated by similar reference numerals and will not further be described.

As shown in FIG. 1, the source regions of the memory transistors 1 and 2 are connected to a source line SLW1, while the source regions of the memory transistors 8 and 4 are connected to a source line SLW2. The control gate electrodes and drain regions of the memory transistors 1–4 are connected to word lines WL1, WL2 and bit lines BL1, BL2, respectively.

The source line SLW1 is connected Co N-channel and P-channel transistors 5 and 7, while the source line SLW2 is connected to N-channel and P-channel transistors 6 and 8. The gate electrodes of the N-channel transistors 5 and 6 are connected to the word lines WL1 WL2 so that a source power (GND level) will be supplied from the first common source line SL1 to the source lines SLW1 and SLW2. The gate electrodes of the P-channel transistors 7 and 8 may receive erase signals as control signals so that a source power (Vpp level) will be supplied from the second common source line SL2 to the source lines SLW1 and SLW2.

In such a manner, the first embodiment comprises the first common source line for supplying a source power required at least for the writing/reading operation to the source lines SLW1 and SLW2 and the second common source line for supplying a source power required at least for the erasing operation to the source lines SLW1 and SLW2. When the word line WL1 is placed in its selected state (VDD or Vpp levels), the source lines SL1 and SLW1 are connected with each other so that the source power (GND level) will be supplied from the first common source line SL1 to the source line SLW1 but not to the source line SLW2. On the contrary, when the word line WL2 is selected, the source power (GND level) will be supplied from the first common source line SL1 to the source line SLW2 but not to the source line SLW1. On the erasing operation, the transistors 7 and 8 are turned on by the erase signal to supply the source power (Vpp level) from the second common source line SL2.

The operation of the first embodiment will now be described.

Figure 2:
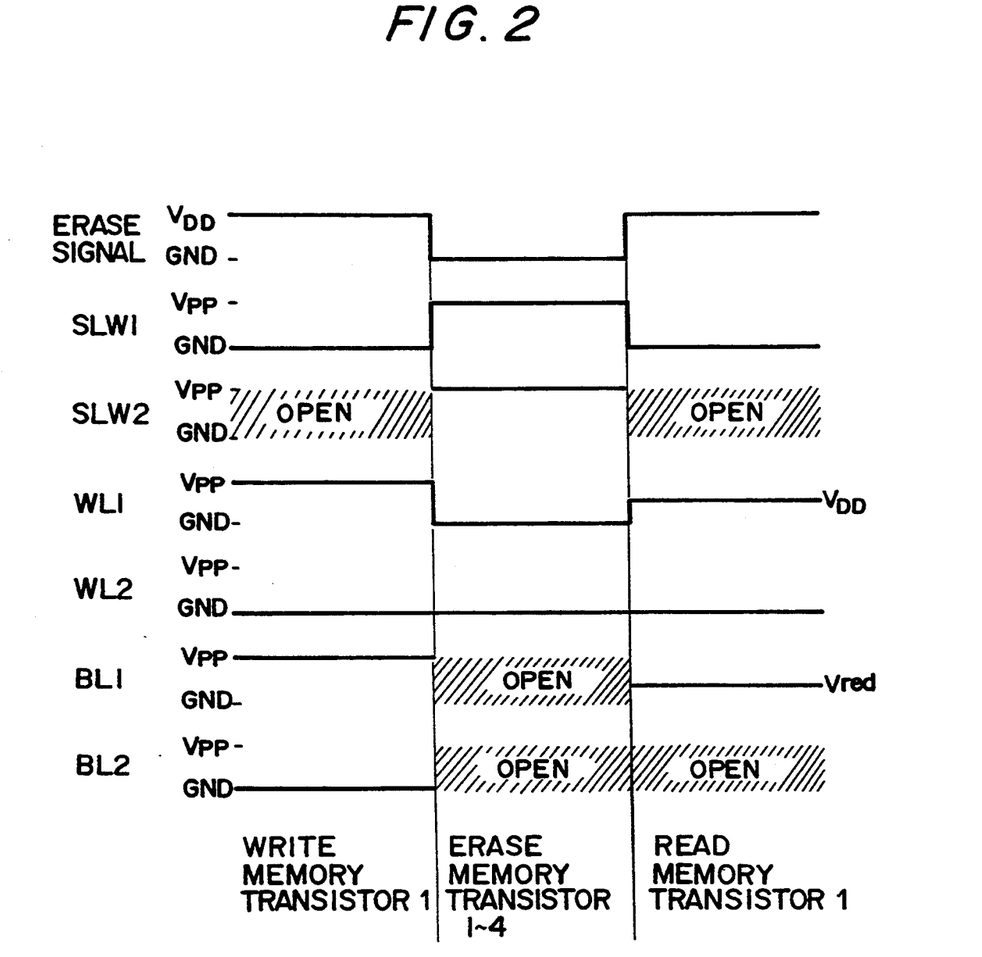
FIG. 2 is a diagram illustrating voltages at various different parts in the first embodiment.

First of all, the writing operation is described. In order to perform the writing operation, the erase signal is set at VDD level to turn the P-channel transistors 7 and 8 off, as shown in FIG. 2. When the writing operation is to be carried out for the memory transistor 1, the lines WL1 and BL1 are set at high voltage Vpp level, and the lines WL2 and BL2 are set at GND level.

Under such a setting, the source lines SLW1 and SLW2 are disconnected from the second common source line SL2 since the P-channel transistors 7 and 8 are in their OFF state. On the other hand, the N-channel transistor 5 is turned on since the word line WL1 is at Vpp level. Thus, only the source line SLW1 will be connected to the first common source line SL1. Therefore, only the source line SLW1 will be set at GND level. Since the word line WL1 and the bit line BL1 are at Vpp level, the voltages only in the memory transistor 1 at its control gate electrode and at its drain region are simultaneously at Vpp level to generate a channel current. As a result, hot electrons are generated at the drain region edge to inject electrons into the floating gate electrode. Thus, the writing operation will be carried out for the memory transistor 1 in which data "0" is stored. On the other hand, since the voltages in the memory transistors 2–4 at their control gate electrodes and at their drain regions are not simultaneously at Vpp level, no channel current will be generated therein. This means that the writing operation is not carried out for the memory transistors 2–4.

The erasing operation will now be described. In order to perform the erasing operation, the erase signal is set at GND level and the P-channel transistors 7 and 8 are turned on, as shown in FIG. 2. Under such a situation, the word lines WL1 and WL2 are set at GND level, and the bit lines BL1 and BL2 are set at Open level.

Under the above setting, the N-channel transistors 5 and 6 are turned off, since the word lines WL1 and WL2 are at GND level. Thus, the source lines SLW1 and SLW2 are disconnected from the first common source line SL1. On the other hand, the source lines SLW1 and SLW2 are connected to the second common source line SL2 since the P-channel transistors 7 and 8 are in their ON state. Thus, the source lines SLW1 and SLW2 will be set at Vpp level. In each of the memory transistors 1–4, therefore, the source region is set at Vpp level and the floating gate electrode is set at GND level. Thus, a tunnel current will be generated between the floating gate electrode and the source region. As a result, electrons are released from the floating gate electrode to the source region to perform the erasing operation.

The reading operation will be described below. In order to perform the reading operation, the erase signal is set at VDD level to turn the P-channel transistors 7 and 8 off, as shown in FIG. 2. When the reading operation is to be carried out for the memory transistor 1, the word line WL1 is set at VDD level, the bit line BL1 is set at Reading level Vred which is a positive voltage, the word line WL2 is set at GND level, and the bit line BL2 is set at Open level.

Under such a setting, the source lines SLW1 and SLW2 are disconnected from the second common source line SL2, since the P-channel transistors 7 and 8 are in their OFF state. On the other hand, the N-channel transistor S is turned on, since the word line WL1 is at VDD level. Thus, the source line SLW1 will be connected to the first common source line, resulting in to be set at GND level. Only in the memory transistor 1, therefore, the control gate electrode will be set at VDD level, the drain region will be set at Vred, and the source region will be set at GND level. If the writing operation has been carried out for the memory transistor 1, or if the data "0" has been stored in the memory transistor 1, the drain current will not flow through the bit line BL1. On the contrary, if the writing operation has not been carried out for the memory transistor 1, or if the data "1" has been stored in the memory transistor 1, the drain current will flow through the bit line BL1. Therefore, the stored data can be read out from the memory transistor 1 by detecting the drain current with the sense amplifier 96.

Under the above condition, the N-channel transistor 6 is turned off to disconnect the source line SLW2 from the first common source line SL1, since the word line WL2 is at GND level. Since the P-channel transistor 8 is also turned off, the source line SLW2 is disconnected From the second common source line SL2. Therefore, the current path from the bit line BL1 through the memory transistor 8 to the source power will be shut off.

It is now assumed that the memory transistor 8 has been overerased by the erasing operation, and that the data "0" had been stored in the memory transistor 1 by the writing operation. Under such a condition, the prior art system shown in FIG. 11 permitted the drain current to flow through the memory transistor 3 when the reading operation was carried out on the memory transistor 1. This caused the reading operation to fail. According to the first embodiment of the present invention, however, the current path from the bit line BL1 through the source line SLW2 to the source power continues to be shut off even if the memory transistor 3 is turned on by the overerasing. Thus, no drain current like in the foregoing will not be generated. As a result, there is no failure in the reading operation.

As described, the first embodiment can prevent the reading operation from failing even if any memory transistor is overerased. It does not require a complicated and large scale control means as in the means for detecting the electric current in the memory transistor to avoid the overerasing in the erasing operation, or as in the means for the verifying operation, and the like. As a result, it is possible to realize a hardware of smaller size and higher speed operation. Since data can be read out from the overerased memory transistor in the first embodiment, the threshold voltage in the memory transistors can be maintained sufficiently low during the erasing operation. As a result, the lower limits of operation margin in all the memory transistors can greatly be increased, and at the same time the reading speed in the memory transistors can be increased.

(2) Second Embodiment

Figure 3:
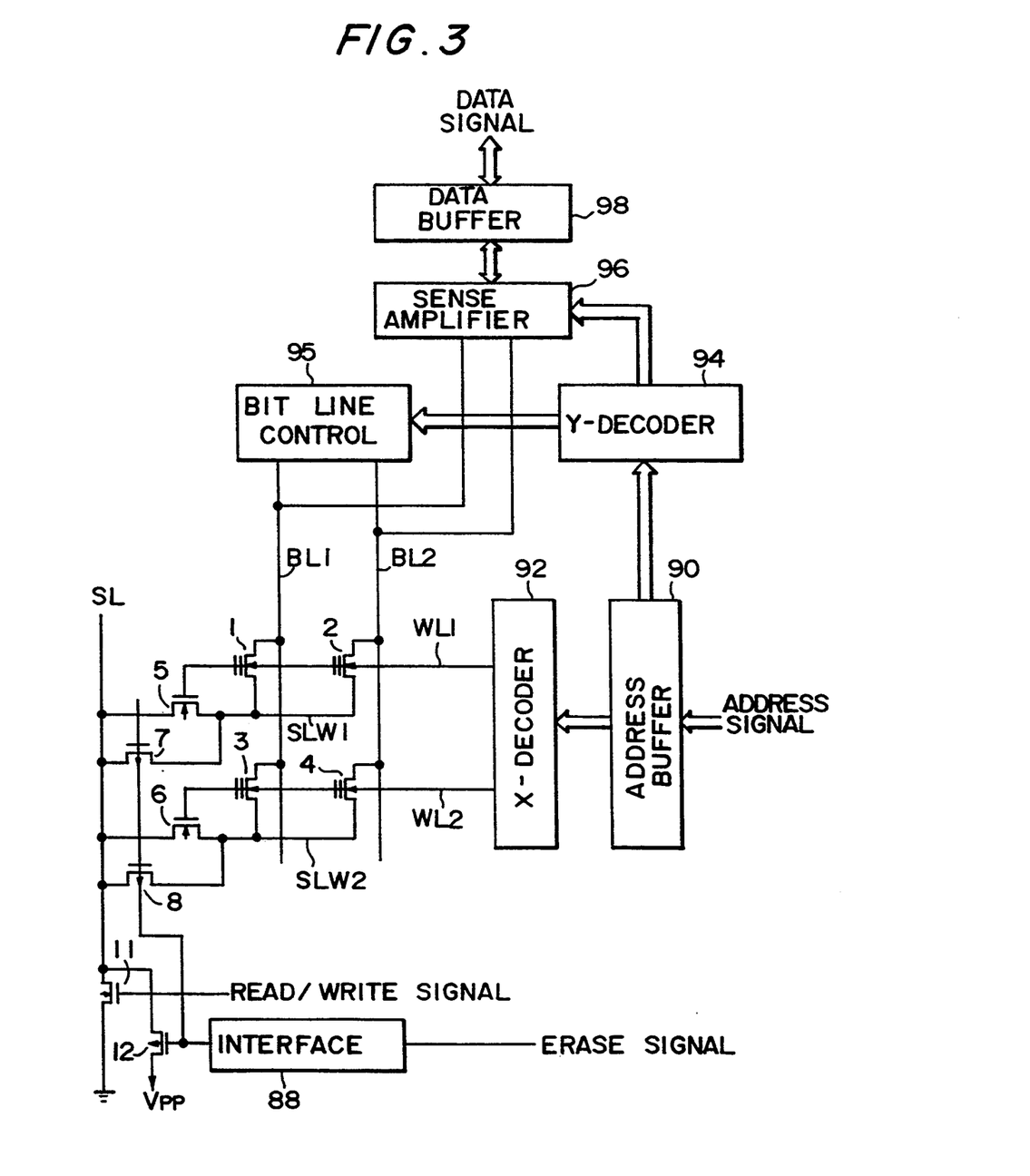
FIG. 3 is a circuit diagram of the second embodiment of a nonvolatile semiconductor system constructed in accordance with the present invention.

FIG. 3 shows the second embodiment of the present invention, of which parts similar to those of FIG. 1 are denoted by the same reference numerals.

The first embodiment separately comprises the first common source line SL1 for supplying a source power to the source lines SLW1 and SLW2 during the writing/reading operation, and the second common source line SL2 for supplying a source power during the erasing operation. In contrast, the second embodiment comprises a single common source line SL obtained by combining the first and second common source lines SL1 and SL2, as shown in FIG. 3. The common source line SL is connected to the N-channel and P-channel transistors 11 and 12. Thus, the common source line SL will be set at GND level during the reading and writing operations and at Vpp level during the erasing operation.

Since the second embodiment is different from the first embodiment only in that the first and second common source lines are replaced by the single common source line SL. The other structure and operation of the second embodiment are similar to those of the first embodiment, and will not further be described.

Figure 7:
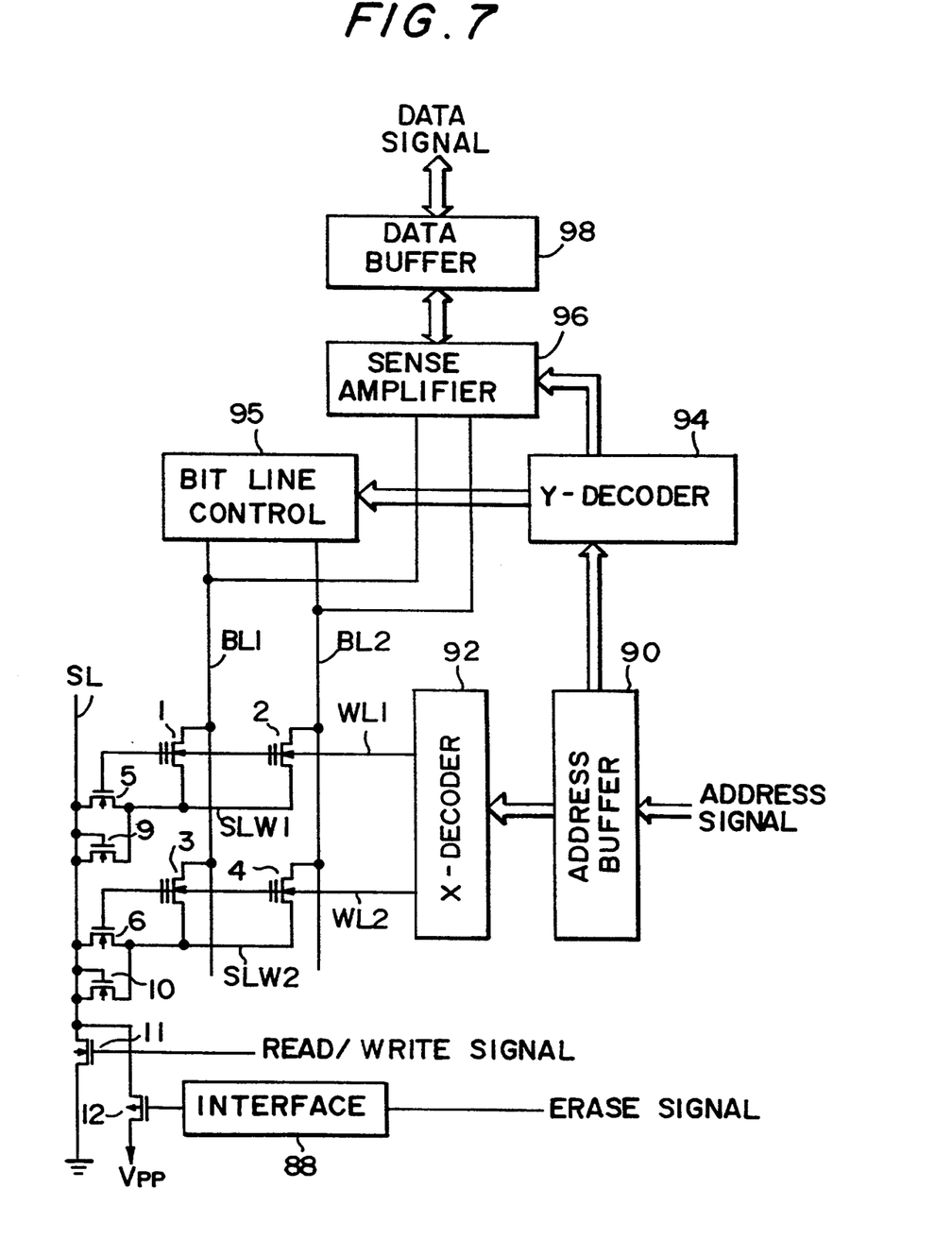
FIG. 7 is a circuit diagram of the third embodiment of a nonvolatile semiconductor system constructed in accordance with the present invention.
Figure 9:
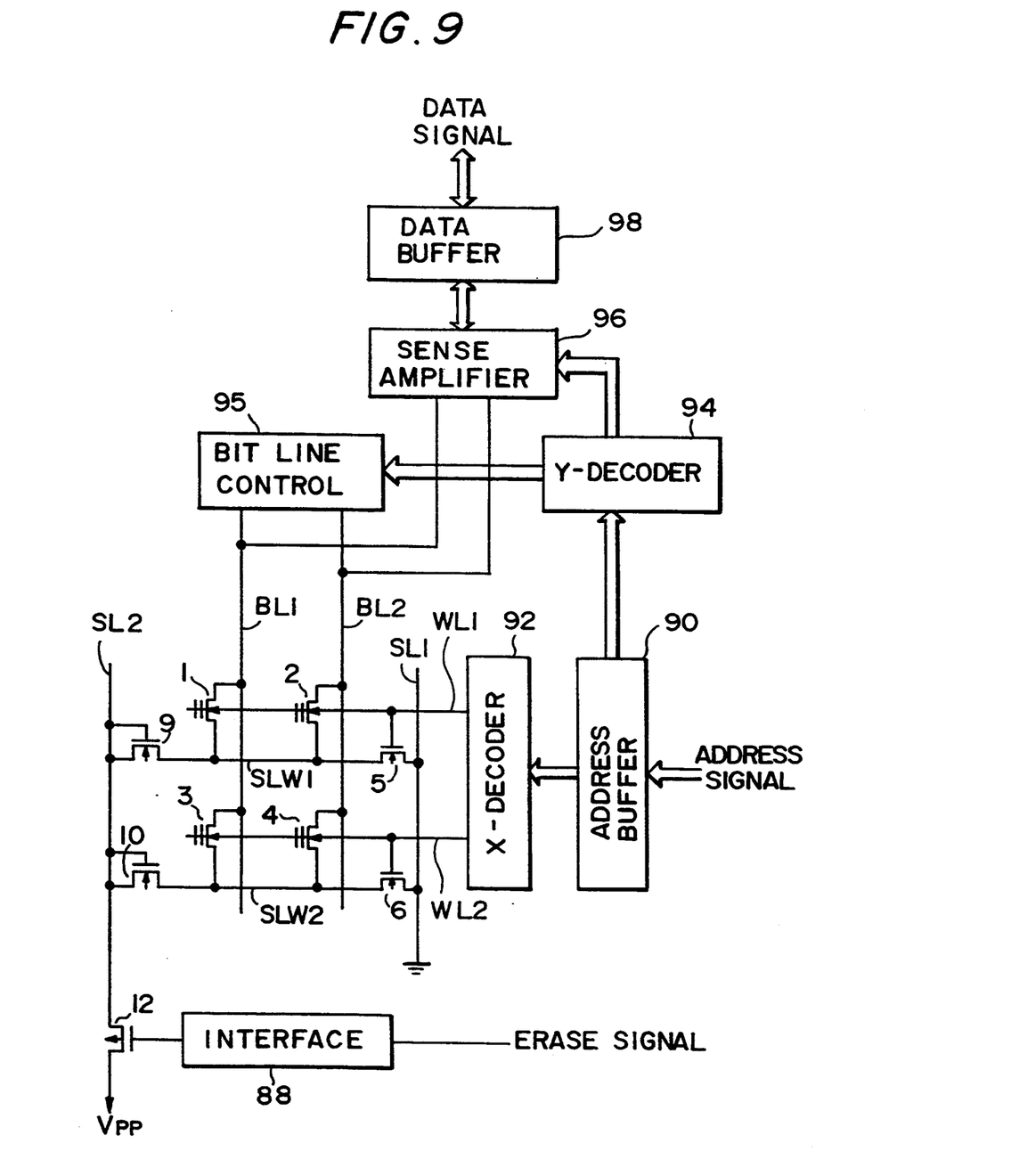
FIG. 9 is a circuit diagram of the fourth embodiment of a nonvolatile semiconductor system constructed in accordance with the present invention.

In the first and second embodiments, the transistors 7 and 8, which are switching elements, are opened or closed by the erase signal inputted into the gate electrodes of the switching elements. In the third and fourth embodiments which will be described, however, the gate electrodes of switching elements, or transistors 9 and 10, are connected to a common source line (SL in the third embodiment, SL2 in the fourth embodiment), as shown in FIGS. 7 and 9. In such a connection, the transistors 9 and 10 become equivalent to diodes in which the direction toward the source lines SLW1 and SLW2 is the forward direction. A voltage drop equal to about 2 volts will thus be produced between the source and drain in each of the transistors 9 and 10.

However, the first and second embodiments utilize the P-channel transistors 7 and 8 which are opened or closed by the erase signal inputted into the gate electrodes of the transistors. Therefore, there will not be a problem of voltage drop as in the third and fourth embodiments. The first and second embodiments does not require to increase the Vpp level taking account of such a voltage drop. Thus, the voltage used in the circuit can be lowered to reduce the power dissipation.

The first and second embodiments are more advantageous than the third and fourth embodiments when the erasing operation is carried out for each block in the memory transistors.

More particularly, the flash EEPROM performs the erasing operation in the entire array erasure manner in which all the memory transistors are simultaneously erased. In such a case, however, the threshold voltage in the memory transistors is widely distributed, leading to difficulty in equalizing the reading characteristics such as access time. As a measure to prevent such a distribution of threshold voltage and as a function expected to a flash EEPROM, a function of erasing the memory transistor for each block or sector is required to be included in a specification of a EEPROM.

Figure 4:
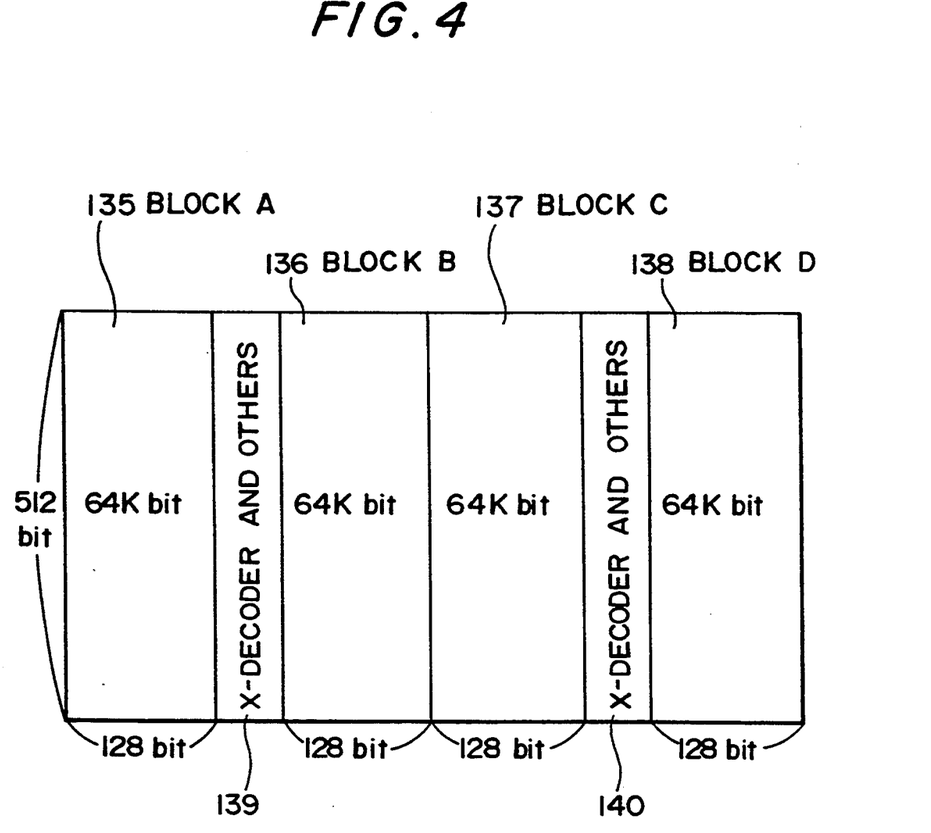
FIG. 4 is a schematic diagram illustrating the division of a memory section into blocks.

When the memory transistor is required to be erasable for each block as mentioned, and if the capacity of the memory section is 256 kbits, the memory section may be divided into four blocks: block A134, block B136, block C137 and block D138, as shown in FIG. 4.

Each of the blocks is 64 Kbits. Blocks 139 and 140 containing X-decoder and others are disposed between the blocks. The erasing operation for the memory transistors will be carried out sequentially starting from a block (e.g. A135) for each block.

Figure 5:
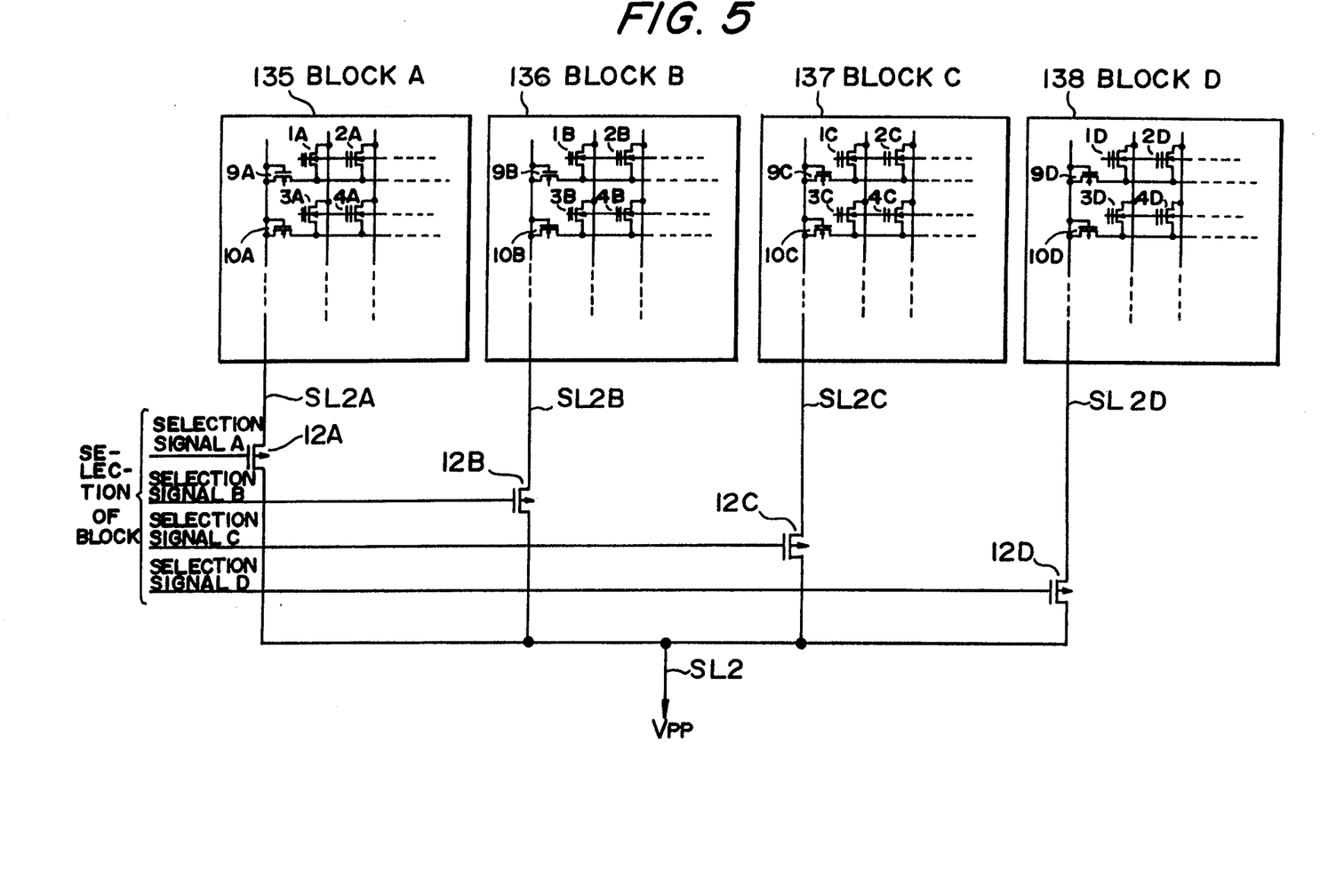
FIG. 5 is a circuit diagram of the fourth embodiment in which the erasing operation is carried out for each block.

FIG. 5 shows a circuit diagram of the fourth embodiment shown in FIG. 9 when the erasing operation is carried out for each block (which is almost the same as that of the third embodiment).

As shown in FIG. 5, the fourth embodiment is required to divide the common source line SL2 into four common source lines SL2A–SL2D when the erasing operation is to be carried out for each block. To this end, P-channel transistors 12A–12D are located between the common source line SL2 and the respective common source lines SL2A–SL2D. The gate electrodes of the P-channel transistors 12A–12D receive selection signals A–D, respectively. On the erasing operation, the transistors 12A–12D are sequentially selected by the selection signals A–D so that the common source lines SL2A–SL2D will sequentially be connected to the common source line SL2 to be supplied with the source power (Vpp level). Thus, the erasing operation can be carried out for each block.

Figure 6:
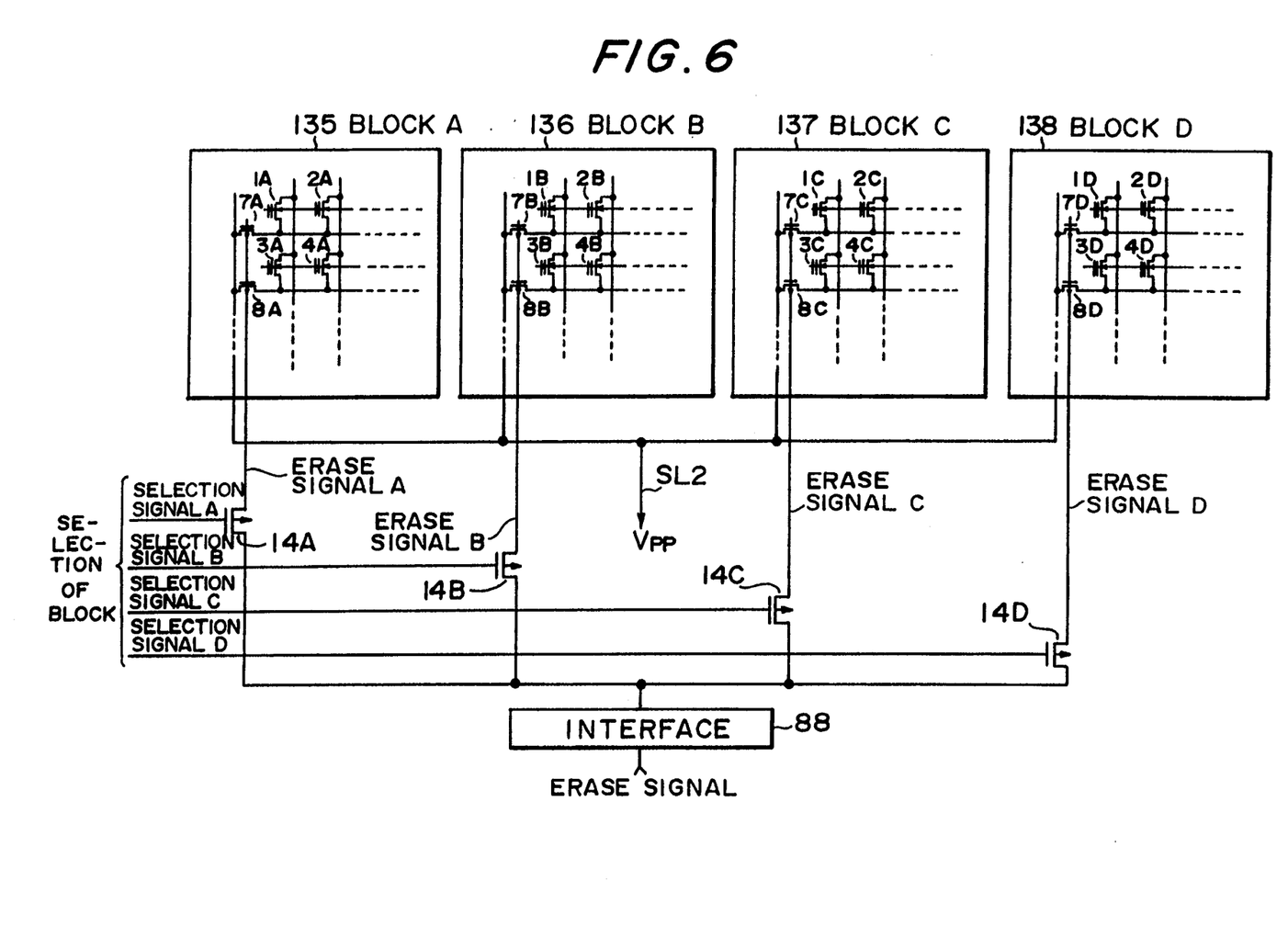
FIG. 6 is a circuit diagram of the first embodiment in which the erasing operation is carried out for each block.

When the erasing operation is carried out for each block in the first embodiment, such a circuit as shown in FIG. 6 is required (this also applies to the second embodiment).

As shown in FIG. 6, the first embodiment only requires the division of the original erase signal into erase signals A–D to perform the erasing operation for each block. To this end, P-channel transistors 14A–14D are located between the original erase signal and the respective divided erase signals A–D. The gate electrodes of the P-channel transistors 14A–14D receive selection signals A–D, respectively. On the erasing operation, the transistors 14A–14D will be selected sequentially by the selection signals A–D so that the erase signals A–D will sequentially be at Vpp level. Thus, the source power (Vpp level) will be supplied from the common source line SL2 to the source region of the memory transistors in each of the blocks. In such a manner, the erasing operation can be carried out for each block.

As described above, the common source line SL2 must be divided into the common source lines SL2A–SL2B when it is wanted to perform the erasing operation for each block in the fourth embodiment. Each of the common source lines SL2A–SL2B is a power supply line for supplying a power to the corresponding memory transistors of which total capacity is as large as 64 kbits for example. Therefore, each of the transistors 12A–12D requires a very large power supply ability to make the size of the transistors quite large. When the erasing operation is to be performed for each block in the fourth embodiment, therefore, the circuit scale will be undesirably increased. Furthermore, the gate capacity will greatly be increased in each of the transistors 12A–12D. Therefore, time required to switch block selection will be increased.

On the contrary, the original erase signal is divided into four erase signals A–D in the arrangement of FIG. 6 for performing the erasing operation for each block in the first embodiment. The divided erase signals A–D are inputted into the gate electrodes of the transistors 7A–7D, 8A–8D and other transistors. Thus, the erase signals A–D function as signals for driving the gate electrodes through which no electric current flows. Therefore, the transistors 14A–14D are small in size with ability of small power supply. The structure of FIG. 6 in which the erasing operation is carried out for each block in the first embodiment will have neither the problem of large-scale circuit nor the problem of increased time required to switch selection of the blocks.

As will be apparent, the first and second embodiments are superior to the third and fourth embodiments to be described in carrying out the erasing operation for each block.

Although the first and second embodiments have been described using P-channel transistors 7 and 8 as switching elements, the present invention is not limited to such an arrangement. For example, the P-channel transistors may be replaced by N-channel transistors. With N-channel transistors, it cannot be avoided to produce a voltage drop at the transistors 7 and 8. The advantages of using P-channel transistors as switching elements in carrying out erasing for each block can be provided similarly by the N-channel transistor arrangement.

(3) Third Embodiment

FIG. 7 shows a circuit diagram of the third embodiment of a flash EEPROM constructed in accordance with the present invention, in which parts similar to those of FIG. 1 are denoted by similar reference numerals.

As shown in FIG. 7, the common source line SL is connected to the source line SLW1 through the N-channel transistors 5 and 9 and to the source line SLW2 through the N-channel transistors 6 and 10. The gate electrodes of the N-channel transistors 5 and 6 are connected to the word lines WL1 and WL2, respectively. The gate electrodes of the N-channel transistors 9 and 10 are connected to the common source line SL to provide a circuit equivalent to a diode, in which the direction toward the source lines SLW1 and SLW2 is the forward direction.

The operation of the third embodiment will now be described.

Figure 8:
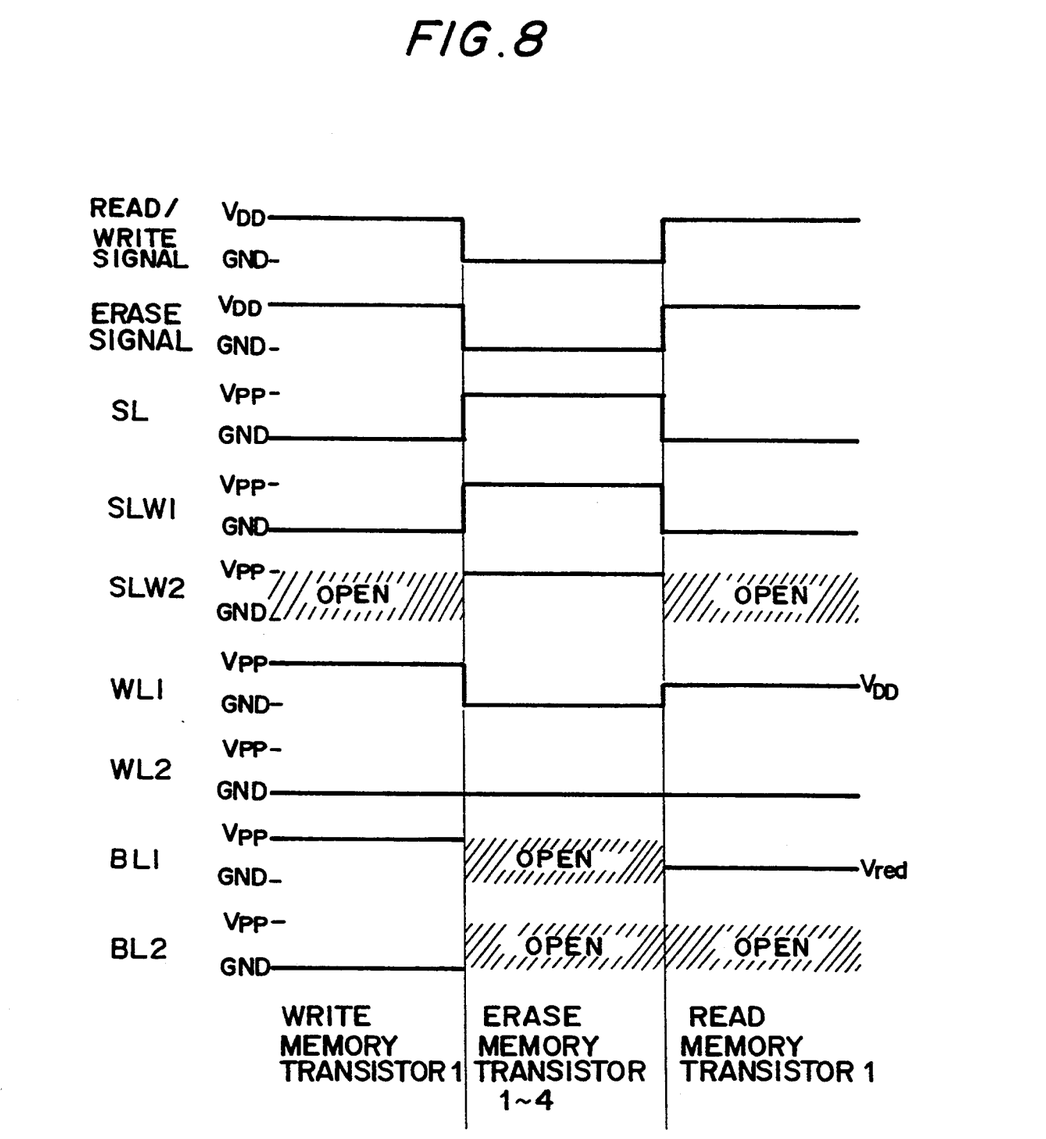
FIG. 8 is a diagram illustrating voltages at various different in the third embodiment.

The writing operation is first described. In order to perform the writing operation, the read/write and erase signals are set at VDD level, while the common source line SL is set at GND level, as shown in FIG. 8. On the writing operation for the memory transistor 1, the lines WL1 and BL1 are set at high voltage Vpp level while the lines WL2 and BL2 are set at GND level.

Under the above setting, the N-channel transistors 9 and 10 are turned off since the common source line SL is at GND level. On the other hand, only the N-channel transistor 5 is turned on to connect only the source line SLW1 to the common source line SL since the word line WL1 is at Vpp level. Thus, only the source line SLW1 will be set at GND level. Since the word and bit lines WL1, BL1 are at Vpp level as described, a channel current is generated only at the memory transistor 1 to inject electrons into the floating gate electrode of the memory transistor. The writing operation will be carried out for the memory transistor i in which the data "0" is stored. On the other hand, the voltages in the memory transistors 2–4 at their control gate electrodes and drain regions will not simultaneously be at Vpp level. Therefore, the data writing operation will not be carried out for the memory transistors 2–4.

The erasing operation will next be described. In order to perform the erasing operation, the read/write and erase signals are set at GND level, while the common source line SL is set at Vpp level, as shown in FIG. 8.

In addition to such settings, the word lines WL1 and WL2 are set at GND level, while the bit lines BL1 and BL2 are set at Open level.

Under such a setting, the N-channel transistors 9 and 10 are turned on to connect the source lines SLW1 and SLW2 to the common source line SL, since the common source line SL is at Vpp level. Thus, the source lines SLW1 and SLW2 will be set at Vpp level (which is lower than the actual Vpp voltage by the threshold voltage in the N-channel transistors 9 and 10). In each of the memory transistors 1-4, therefore, the source region and floating gate electrode are at Vpp level (which is lower than the actual Vpp voltage by the threshold voltage) and at GND level, respectively. As a result, electrons are released from the floating gate electrode to the source region to perform the erasing operation.

The reading operation will now be described. In order to perform the reading operation, the read/write and erase signals are set at VDD level, and the common source line SL is set at GND level, as shown in FIG. 8. When data is to be read out from the memory transistor 1, the word line WL1 is set at VDD level, the bit line BL1 is set at Read level Vred which is a positive voltage, the word line WL2 is set at GND level, and the bit line BL2 is set at Open level.

Under the above setting, the N-channel transistors 9 and 10 are turned off, since the common source line SL is at GND level. On the other hand, only the N-channel transistor 5 is turned on, since the word line WL1 is at VDD level to set only the source line SLW1 at GND level. Only in the memory transistor 1, therefore, the control gate electrode, drain region, and source region are set at VDD level, Vred level, and GND level, respectively. If the data "0" has been stored in the memory transistor 1, no drain current will flow through the bit line BL1. On the contrary, a drain current will flow if the data "1" has been stored in the memory transistor 1. Thus, the stored data can be read out by detecting the drain current at the sense amplifier 96.

Under such a situation, the word line WL2 and common source line SL are at GND level to turn off both the N-channel transistors 6 and 10. Thus, the source line SLW2 is disconnected from the common source line SL so that the current path from the bit line BL1 through the memory transistor 3 to the source power will be shut off. For example, when data is to be read out from the memory transistor 1, the electric current will not flow from the bit line BL1 through the memory transistor 3 to the common source line SL even if the memory transistor 3 has been overerased.

In such a manner, the third embodiment has the same advantage as that of the first embodiment. A incorrect reading operation can be avoided even if any memory transistor has been overerased. Therefore, the third embodiment does not require any complicated means for preventing the overerasing, such as verifying operation means or the like. Thus, the hardware can be reduced in scale with increase of the operational speed. In addition, since the threshold voltage in the memory transistors can be maintained sufficiently low, the lower limit of operation margin in the memory transistors can be increased with increase of the reading speed.

(4) Fourth Embodiment

FIG. 9 shows the fourth embodiment of a flash EEPROM constructed in accordance with the present invention, in which parts similar to those of FIG. 7 are denoted by similar reference numerals.

The third embodiment aforementioned utilizes a single common source line SL used in the reading/writing and erasing operations. However, the fourth embodiment comprises first and second common source lines SL1 and SL2 separated from the common source line SL, as shown in FIG. 9. On the reading and writing operations, the source power (GND level) is supplied from the first common source line SL1 to the memory transistors. On the erasing operation, the source power (Vpp level, but it is lower than the actual Vpp voltage by the threshold voltage of the N-channel transistor) is supplied from the second common source line SL2 to the memory transistors.

The fourth embodiment is different from the third embodiment only in that the common source line SL is divided two, first and second common source lines SL1 and SL2. The other structure and operation of the fourth embodiment are similar to those of the third embodiment, and will not further be described.

The present invention is not limited to the aforementioned embodiments, but may be carried out in various modifications and changes within the concept of the invention.

Although the first to fourth embodiments have been described as a plurality of memory transistors being connected to one of the word lines, the present invention may similarly be applied to an arrangement in which only one of the memory transistors is connected to one of the word lines.

Figure 10A:
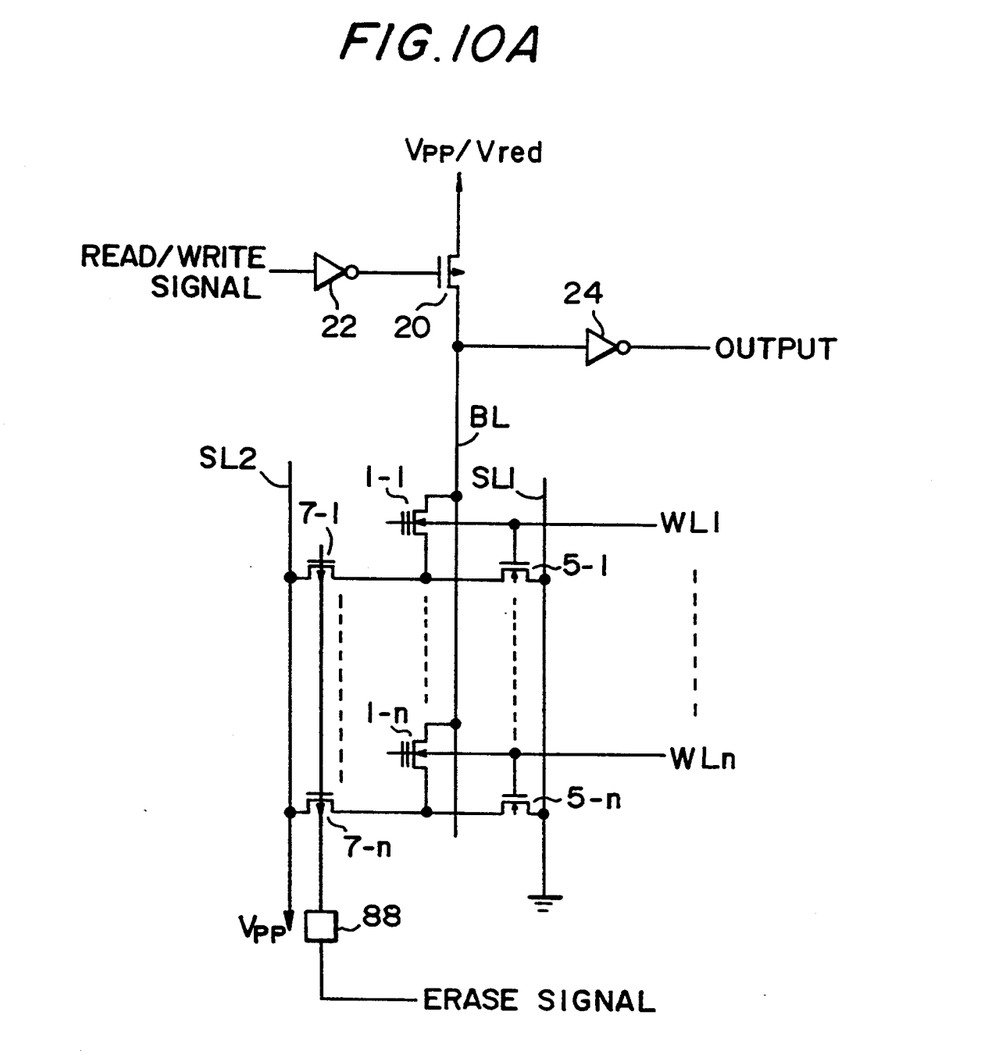
FIG. 10A is a circuit diagram of the first embodiment which is applied to a PLD.

For example, the present invention may be applied to a PLD (programmable logic device) in which each single memory transistor is connected to a different word line. FIG. 10A shows a circuit diagram of a PLD to which the first embodiment of the present invention is applied. As shown in FIG. 10A, the PLD comprises a plurality of word lines WL1-WLN each of which is connected to each of memory transistors 1-1 to 1-n. The source region of each of the memory transistors 1-1 to 1-n is connected to the first and second common source lines SL1 and SL2 through the respective one of the N-channel transistors 5-1 to 5-n and through the respective one of the P-channel transistors 7-1 to 7-n. A bit line BL is connected to a P-channel transistor 20, the gate electrode of which receives the read/write signal through an inverter 22. The bit line BL is also connected to an inverter 24, the output of which is used as the output of the PLD circuit itself.

Figure 10B:
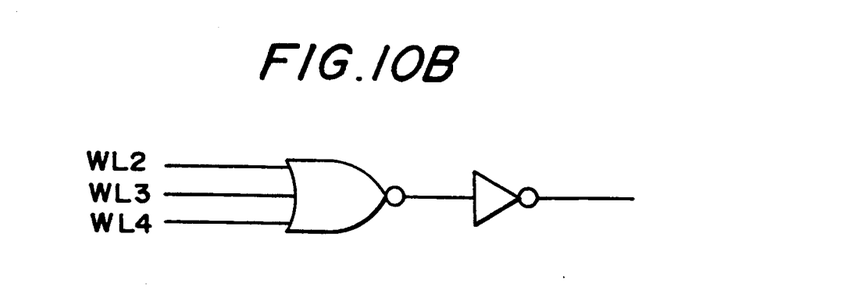
FIG. 10B is an example of a logic circuit which can be realized by the arrangement of FIG. 10A.

The circuit shown in FIG. 10A can be used to form a desired logic circuit. If it is wanted to realize an OR circuit shown in FIG. 10B, all the memory transistors 1-1 to 1-n are erased first. Thereafter, the writing operation is carried out for the memory transistors other than the memory transistors 1-2, 1-3 and 1-4 which are connected to the word lines WL2, WL3 and WL4, respectively. Thus, data "1" is stored in the memory transistors 1-2, 1-3 and 1-4, while the data "0" is stored in the other memory transistors.

The data reading operation is then carried out. At this time, the data "1" has been stored in the memory transistors 1-2, 1-3 and 1-4 as described. The P-channel transistor 20 is in its ON state. If any one of the word lines WL2, WL3 and WL4 becomes VDD level, a drain current will flow through the bit line BL, and the output of the inverter 24 will be at H level. If all the word lines WL2, WL3 and WL4 become GND level, no drain current will flow through the bit line BL, and the output of the inverter 24 will be at L level. Therefore, the circuit shown in FIG. 10A will have the same function as that of the OR circuit shown in FIG. 10B.

In the circuit of FIG. 10A described, the reading operation can be prevented from failing even if any one memory transistor is overerased, as in the first embodiment. Thus, the circuit of FIG. 10A does not require any complicated means for preventing the overerasing, such as verifying means. This means that the circuit can greatly be simplified.

Embodiments of the present invention in which different word line is supplied to each memory transistor is not limited to the embodiment shown in FIG. 10A. For example, the present invention may also be applied as a switching means of a redundant memory for correcting the error memory transistors in large capacity memories such as DRAMs, SRAMs, and the like.

We claim:

1. A nonvolatile semiconductor system comprising:
   a plurality of memory transistors arranged in a matrix, each of said memory transistors comprising a floating gate electrode, a control gate electrode, a source region and a drain region;
   a plurality of source lines, the source region of each of said memory transistors being connected to one of said source lines;
   at least one bit line, the drain region of each of said memory transistors being connected to one of said at least one bit lines;
   a plurality of word lines, the control gate electrode of each of said memory transistors being connected to one of said word lines;
   a first common source line connected to each source line to supply a first source power required at least for the writing/reading operation to each source line;
   a second common source line connected to each source line to supply a second source power required at least for the erasing operation to each source line;
   a transistor connected between said first common source line and one of said source lines, said one of said source lines being connected to the source region of at least one memory transistor, wherein the transistor is conductive when the at least one memory transistor is selected by the said one of said word lines; and
   a plurality of switching elements, each switching element connected between a respective one of said source lines and said second common source line, each switching element selectively applying the second source power to said respective one source line based on control signals.

2. The nonvolatile semiconductor system of claim 1, wherein each said switching element is a P-channel transistor having a gate electrode, the gate electrode of each said P-channel transistor receiving an erase signal as said control signal to selectively apply the second source power to said respective one source line.

3. The nonvolatile semiconductor system of claim 1, wherein each said switching element is a N-channel transistor having a gate electrode, the gate electrode of said N-channel transistor receiving an erase signal as said control signal to selectively apply the second source power to said respective one source line.

4. The nonvolatile semiconductor system of claim 1, wherein each said switching element is a N-channel transistor having a gate electrode connected to said second common source line, the gate electrode of each said N-channel transistor receiving said control signal to selectively apply the second source power to said respective one source line.

5. A nonvolatile semiconductor system comprising:
   a plurality of memory transistors arranged in a matrix, each of said memory transistors comprising a floating gate electrode, a control gate electrode, a source region and a drain region;
   a plurality of source lines, the source region of each of said memory transistors being connected to one of said source lines;
   at least one bit line, the drain region of each of said memory transistors being connected to one of said at least one bit lines;
   a plurality of word lines, the control gate electrode of each of said memory transistors being connected to one of said word lines;
   a common source line connected to the plurality of source lines, the common source line applying one of a plurality of source powers to the source lines, said plurality of source powers including a first source power required at least for writing/reading operation and a second source power required at least for erasing operation;
   a transistor connected between said common source line and one of said source lines, said one of said source lines being connected to the source region of at least one memory transistor, wherein the transistor is conductive when the at least one memory transistor is selected by said one of said word lines; and
   a plurality of switching elements, each switching element connected between a respective one of said source lines and said common source line, each switching element selectively applying the one of the plurality of source powers to the respective one of the source lines based on control signals.

6. The nonvolatile semiconductor system of claim 5, wherein each said switching element is a P-channel transistor having a gate electrode, the gate electrode of each said P-channel transistor receiving an erase signal as said control signals to selectively apply the one of the plurality of source powers to the respective one of said source lines.

7. The nonvolatile semiconductor system of claim 5, wherein each said switching element is a N-channel transistor having a gate electrode, the gate electrode of each said N-channel transistor receiving an erase signal as said control signals to selectively apply the one of the plurality of source powers to the respective one of said source lines.

8. The nonvolatile semiconductor system of claim 5, wherein each said switching element is a N-channel transistor having a gate electrode connected to said common source line, the gate electrode of each said N-channel transistor receiving said control signals to selectively apply the one of the plurality of source powers to the respective one of said source lines.

* * * * *